US005570313A

United States Patent [19]
Masson et al.

[11] Patent Number: 5,570,313
[45] Date of Patent: Oct. 29, 1996

[54] MEMORY INSENSITIVE TO DISTURBANCES

[75] Inventors: Thierry Masson, St. Egreve, France; Richard Ferrant, Carrollton, Tex.

[73] Assignee: Thomson-CSF Semiconducteurs Specifiques, Paris, France

[21] Appl. No.: 544,009

[22] Filed: Oct. 17, 1995

[30] Foreign Application Priority Data

Oct. 18, 1994 [FR] France .................................. 94 12412

[51] Int. Cl.$^6$ ............................ G11C 11/34; G11C 7/02
[52] U.S. Cl. ........................ 365/174; 365/181; 365/206; 365/227
[58] Field of Search ................................... 365/174, 181, 365/206, 227

[56] References Cited

U.S. PATENT DOCUMENTS 5,157,625  10/1992  Barry ........................................ 365/154
5,410,507   4/1995  Tazunoki et al. ........................ 365/227

OTHER PUBLICATIONS

IBM Technical Disclosure Bulletin, Twice Redundant Radiation Hardened Latch, vol. 30, No. 8, Jan. 1988, pp. 248–249.

Kerns, Sherra E., The Design of Radiation–Hardened ICs for Space: A Compendium of Approaches, Proceedings of the IEEE, Nov. 1988, pp. 1470–1509.
Diehl, S. E. and Vinson, J. E., Consideration for Single Event Immune VLSI Logic, IEEE Transactions on Nuclear Science, vol. 30, No. 6, Dec. 1983, pp. 4501–4507.
U.S. Ser. No. 08/099,656 Jul. 30, 1993 abandoned.
U.S. Ser. No. 08/274,142 Jul. 14, 1994 5,410,506 Apr. 25, 1995.
U.S. Ser. No. 08/201,034 Feb. 24, 1994 5,469,485 Nov. 21, 1995.

*Primary Examiner*—David C. Nelms
*Assistant Examiner*—Trong Phan
*Attorney, Agent, or Firm*—Roland Plottel

[57] ABSTRACT

The invention concerns a memory cell insensitive to disturbances. The memory cell, that contains information in the form of two complementary logical levels (X, C(X)), each logical level being stored in a node of the cell (N1, N2), is characterized in that it comprises means of storing the same logical level in two different nodes (N1, N2, N3, N4), the said means being able to restore any logical level to its initial state preceding a modification made on it due to a disturbance, as a result of holding the value of one of the two logical levels complementary to the logical level that was modified.

5 Claims, 3 Drawing Sheets

5,570,313

MEMORY INSENSITIVE TO DISTURBANCES

BACKGROUND OF THE INVENTION

This invention concerns an integrated circuit memory and particularly a register type memory in which information exists in the form of two complementary logical levels each confirming the other.

This type of memory is very sensitive to loss of information due to added energy from the outside such as, for example, the addition of energy from a heavy ion passing through the semiconductor material at the junction at which one of the two logical levels is stored.

The junction behaves like a capacitance that is charged by electron/hole pairs created during the impact with the heavy ion. If the value of the capacitance is denoted C, and the change in the charge of the capacitance resulting from the impact is denoted $\Delta Q$, there is a voltage change $\Delta V$ at the capacitance terminals such that $\Delta V = \Delta Q/C$.

The voltage variation $\Delta V$ can then reach a level such that the logical level which is stored in the junction changes, also changing the complementary logical level. The complementary logical levels confirm each other, with the result that the memory cell is in a stable state different from the initial state.

Using modern technologies, circuits can be made with smaller and smaller dimensions. The capacitance C of junctions can then be made very small. The result is that the voltage change $\Delta V$ very often reaches the stored information switching limit for a low quantity of charge $\Delta Q$.

The expert in the subject knows several methods of overcoming this disadvantage.

The first method is to place a resistance R in series with each capacitance junction C, such that the time constant for each RC network thus made up is greater than the disturbance of the duration. In order to be efficient, the resistance R must be of the order of 100 to 500 k$\Omega$. Values of this order or magnitude are difficult to achieve, particularly using the most widespread technologies at the present time in which polysilicon used to make the gates is coated with silicide. The silicide then has to be removed in order to reach the high resistance values mentioned above. This operation is difficult and gives very low efficiencies.

A second method consists of adding capacitances at sensitive nodes. The critical charge is thus increased and the voltage change $\Delta V$ is reduced. In order to avoid increasing the area sensitive to disturbances, the added capacitances must not contain a diffused area. The values of capacitances are thus limited, making them less useful.

In general, these two methods have other disadvantages. Added resistances and capacitances very significantly increase the dimensions of the memory cells. Furthermore, write phases are often slowed thus reducing "set-up" and "hold" times.

This invention does not have these disadvantages.

SUMMARY OF THE INVENTION

The purpose of this invention is a memory cell containing information in the form of two complementary logical levels, each logical level being stored in a node in the cell, wherein it comprises means of storing the same logical level in two different nodes, the said means being capable of restoring any logical level to its initial state preceding the modification that was made to it by a disturbance.

BRIEF DESCRIPTION OF THE DRAWINGS

Other characteristics and advantages of the invention will become obvious when reading a preferred embodiment made with reference to the Figures in the appendix, in which.

The same marks refer to the same elements on each of these Figures.

DESCRIPTION OF THE INVENTION

Figure 1:
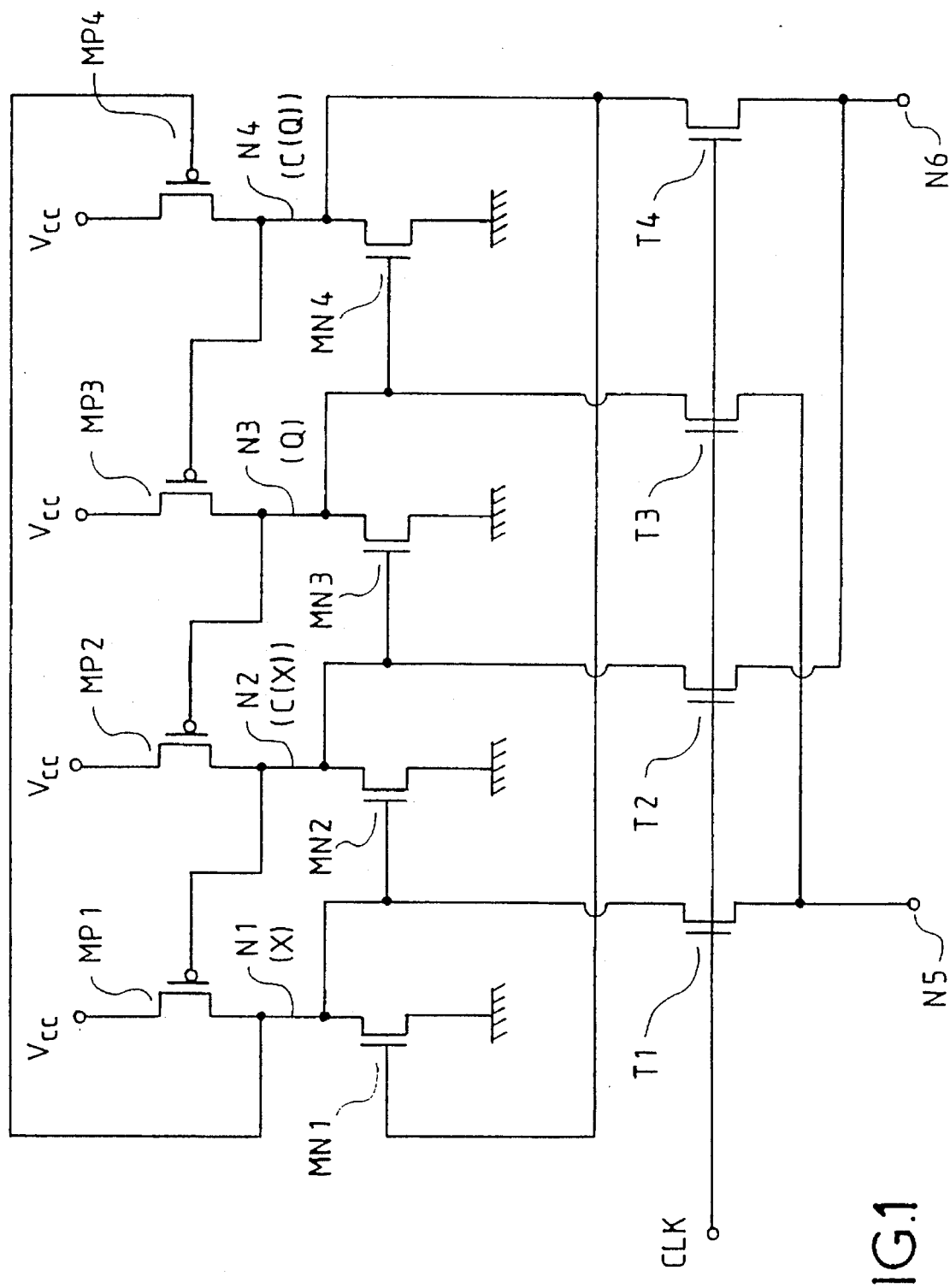
FIG. 1 shows a memory cell according to the invention

FIG. 1 shows a memory cell according to the invention.

The memory cell consists of four P type MOS transistors, MP1, MP2, MP3, MP4 and four N type MOS transistors, MN1, MN2, MN3, MN4. The sources of transistors MP1, MP2, MP3 and MP4 are connected to the DC power supply voltage Vdc, for example equal to +5 volts, and the sources of transistors MN1, MN2, MN3 and MN4 are connected to the circuit earth. The drain of transistor MPi with index i (i=1, 2, 3, 4) is connected to the drain of transistor MNi.

The gate of transistor MPi (i=1, 2, 3) is connected to the drain of transistor MP (i+1), and the gate of transistor MP4 is connected to the drain of transistor MP1. Similarly, the drain of transistor MNi (i=1,2, 3) is connected to the gate of transistor MN(i+1) and the drain of transistor MN4 is connected to gate of transistor MN1.

According to the invention, the information is stored in four nodes N1, N2, N3, N4. Node Ni (i=1, 2, 3, 4) is the drain of transistor MPi.

Node N1 contains information in the form of a logical level X. Therefore, X=1 or X=0.

Node N2 contains information in the form of a logical level C(X), where C(X) is the logical level complementary to logical level X. Therefore:

C(X)=0 for X=1

C(X)=1 for X=0.

Nodes N3 and N4 contain information in the form of logical levels Q and C(Q), respectively, where Q=X and C(Q)=C(X).

Thus, the circuit in the invention can store the same logical level in two different nodes.

FIG. 1 also shows the clock signal CLK and the four N type MOS transistors, T1, T2, T3 and T4 used to write information about nodes N1, N2, N3,and N4, respectively. Stored information may also be read by transistors T1, T2, T3, T4, or by any other circuit known to an expert in the subject and providing access to the memory cell.

Node Ni (i=1, 2, 3, 4) is connected to the drain of transistor Ti. The sources of transistors T1 and T3 are connected to each other and to the same access node N5 and sources of transistors T2 and T4 are connected to each other and to the same access node N6.

As an example, the invention will be explained considering one of the two possible configurations of the memory cell. The configuration is:

$$X = Q = 1$$
$$C(X) = C(Q) = 0$$

In this configuration, transistors MN1 and MN3 are blocked and transistors MN2 and MN4 are conducting. Similarly, transistors MP1 and MP3 are conducting, whereas transistors MP2 and MP4 are blocked.

The impact of heavy ions on the junctions of transistors MN1 and MN3 then creates negative voltage disturbances on information stored at nodes N1 and N3, respectively.

Similarly, the impact of heavy ions on the junctions of transistors MP2 and MP4 creates positive voltage disturbances on information stored at nodes N2 and N4, respectively.

As an example, the invention will be described in the case in which the impact of heavy ions takes place on the junction of transistor MN1. Due to the symmetry of the Circuit, the consequences of an impact of heavy ions on the junctions of the other transistors could be demonstrated in the same way.

As we have already mentioned, the impact of heavy ions on the junction of transistor MN1 creates a negative voltage disturbance. This disturbance may not change the state (conducting or blocked) of the various MPi and MNi transistors (i=1, 2, 3, 4), if its amplitude is low. The return to the initial state then takes place naturally. However if the amplitude of the disturbance is large, it is possible that the voltage drop that appears on node N1 will block transistor MN2 and put transistor MP4 into the conducting state. Since transistor MN2 is blocked, the impedance on node N2 becomes high. However, logical level C(X) remains equal to zero, so that transistor MP1 remains conducting and transistor MN3 remains blocked.

Putting transistor MP4 into the conducting state changes the value of the voltage applied to node N4, since there is then a conflict between MP4 and MN4. The value of the voltage applied to node N4 is V(N4) such that:

$$V(N4) = \frac{R(MP4)}{R(MP4) + R(MN4)} \times Vdc$$

R(MP4) and R(MN4) are the values of the resistances of the channels passing through transistors MP4 and MN4 in the conducting state, respectively. It follows that the voltage applied to the gate of transistor MP3 increases, which has the effect of making this transistor less conducting. This change to the conduction of transistor MP3 may even block it.

The impedance of node N3 is high since transistor MN3 is blocked. Logical level Q therefore remains equal to 1 and transistor MP2 remains blocked. Since transistor MN2 is blocked due to the disturbance, the logical level C(X) of node N2 remains equal to zero. Transistor MP1 then compensates for the disturbance by returning logical level X to 1. Transistor MN2 then become conducting and MP4 becomes blocked, thus putting the cells back into its initial state.

Thus, logical level X returns to its initial state 1 because logical level C(X) is kept to 0.

More generally, for the configuration X=1, C(X)=0, Q=1, C(Q)=0, if level C(X) is disturbed it will return to 0 due to the fact that level X is held at 1, if level Q is disturbed it will return to 1 since level C(Q) is held at 0, and if level C(Q) is disturbed it will return to 0, since level Q is held at 1.

Similarly, for a configuration X=0, C(X)=1, Q=0, C(Q)=1, if level X is disturbed it will return to 0 because C(Q) is held at 1, if level C(X) is disturbed it will return to 1 since level Q is kept at 0, if level Q is disturbed it will return to 0 since level C(X) is held at 1 and if level C(Q) is disturbed it will return to 1 because level X is kept at 0.

Thus, the memory cell according to the invention includes means of returning to the initial configuration preceding a change of a logical level caused by a disturbance, due to the fact that the value of one of the two logical levels complementary to the changed value remains unchanged.

An advantage of the memory cell according to the invention is that it never enables switching of the cell. Devices used in prior art all enable switching when the energy of the heavy ion exceeds a certain threshold. For example, for circuits with resistive type correction known in prior art, this energy level is approximately equal to 35 Mev/mg/cm$^2$ for resistance values equal to 500 k$\Omega$. This creates currents of the order of 10 mA passing through junctions. Currents of the order of 20 A have been measured in junctions in the memory cell according to the invention, without switching. Therefore, the memory cell according to the invention prevents information switching regardless of the so energy level reached by the heavy ions.

Most registers require the use of controls in order to quickly initialize the contents of memory cells.

As the expert in the subject is aware, there are two different types of controls for initializing a cell memory.

The first type of control consists of $\overline{\text{RESET}}$ and $\overline{\text{SET}}$ controls. The $\overline{\text{RESET}}$ control forces logical level X to 0, and the $\overline{\text{SET}}$ control forces logical level Q to 0.

The second type of control consists of RESET and SET controls. The RESET control forces logical level X to 1, and the SET control forces logical level Q to 1.

Figure 2:
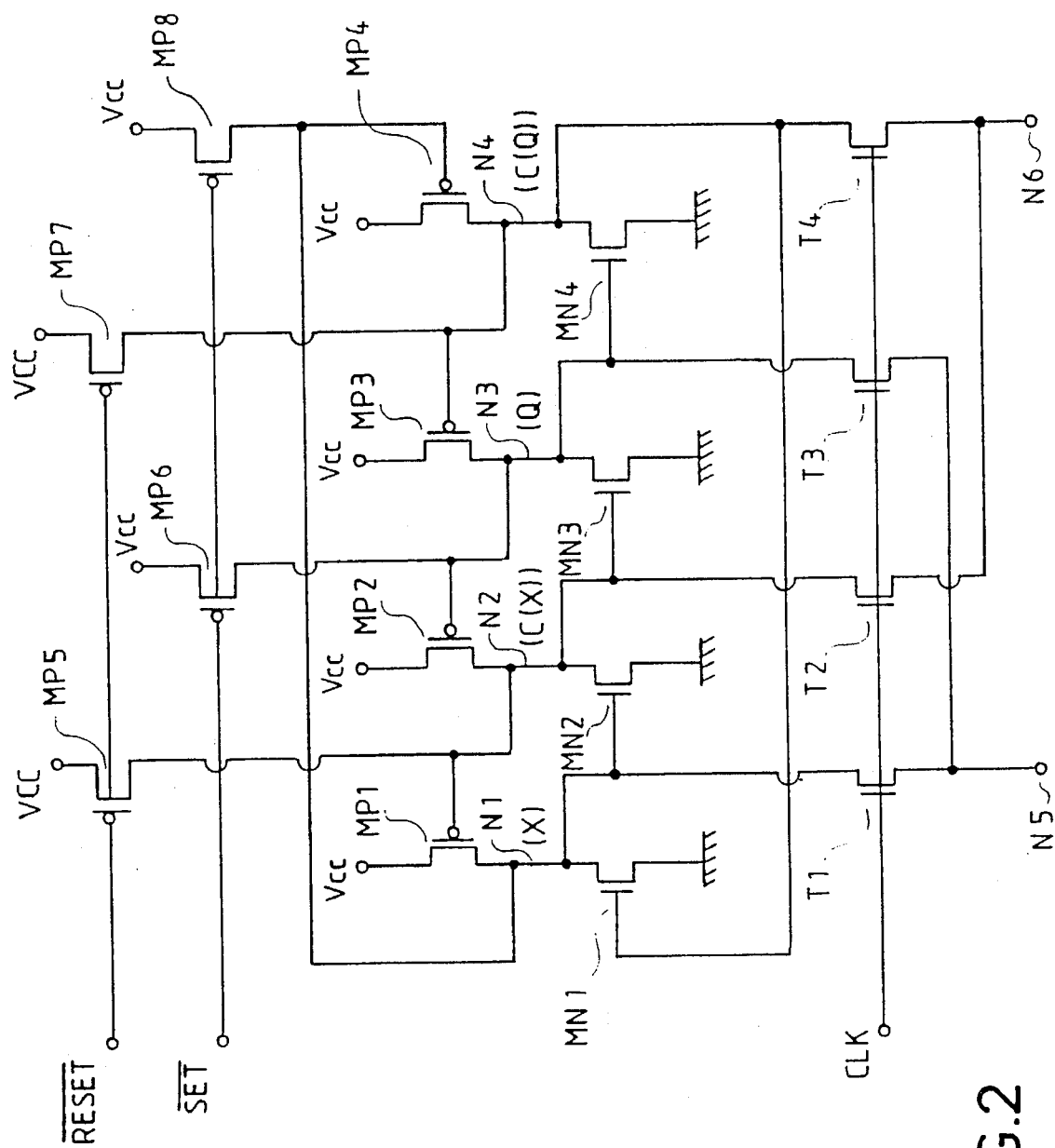
FIGS. 2 and 3 each shows a memory cell according to the invention in the case in which the memory cell includes controls for initializing its contents.

FIG. 2 shows a memory cell according to the invention when the memory includes the $\overline{\text{RESET}}$ and $\overline{\text{SET}}$ controls.

The $\overline{\text{SET}}$ control is applied to the gates of two P type MOS lo transistors denoted MP6 and MP8 on FIG. 2. The drains of transistors MP6 and MP8 are connected to the same power supply Vdc (denoted VCC on the Figure), the source of transistor MP6 and the source of transistor MP8 being connected to memory cell nodes N3 and N1, respectively.

Similarly, the $\overline{\text{RESET}}$ control is applied to the gates of the two P type MOS transistors denoted MP5 and MP7. The drains of transistors MP5 and MP7 are connected to the same power supply voltage Vdc, the source of transistor. MP5 is connected to node N2 and the source of transistor MP7 is connected to node N4.

The $\overline{\text{SET}}$=0 control forces X and Q to 0 through transistors MP8 and MP6, respectively. Since transistor MN2 is conducting and transistor MP2 is blocked, it follows that C(X)=1. Similarly, since transistor MP4 is conducting and transistor MP4 is blocked, it follows that C(Q)=1.

The $\overline{\text{RESET}}$=0 controls force C(X) and C(Q) to 0 through transistors MP5 and MP7, respectively, the logical levels of X and Q then being equal to 1.

Figure 3:
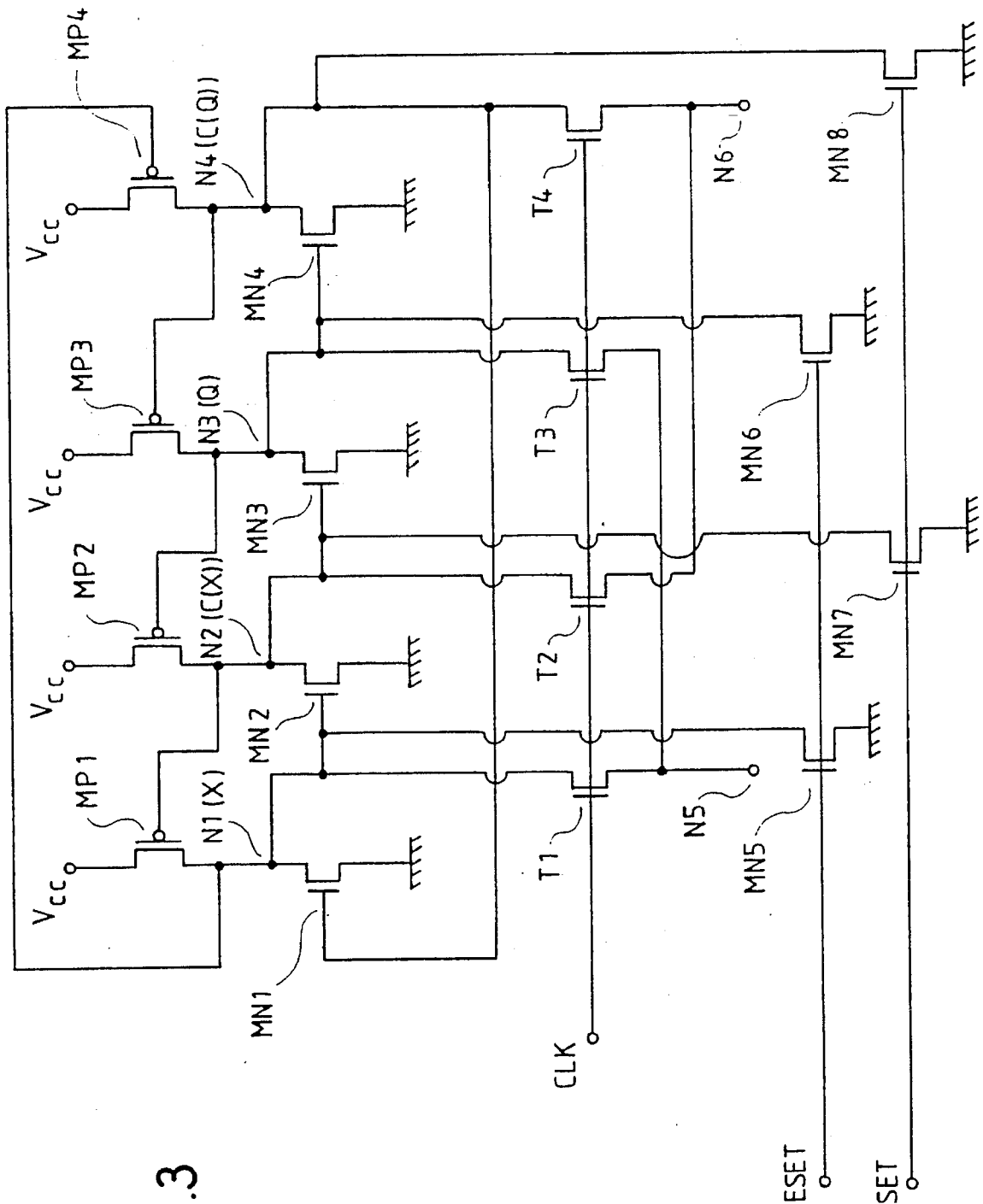

FIG. 3 shows a memory cell according to the invention in the case in which the memory includes controls denoted SET and RESET.

The SET control is applied to the gates of two N type MOS transistors MN7 and MN8, and the RESET control is applied to the gates of two N type MOS transistors MN5 and MN6. The sources of transistors MN5, MN6, MN7, MN8 are connected to the circuit earth. The drains of transistors MN5, MN6, MN7 and MN8 are connected to nodes N1, N3, N2 and N4, respectively.

An advantage of the memory cell according to the invention is that it is very easy to control the SET and RESET, or $\overline{\text{SET}}$ and $\overline{\text{RESET}}$ controls.

It will be preferable to use P type MOS transistors for SET and RESET functions when high density circuits are to be made. The integrated circuit mask is very easy to make in this embodiment and can be extremely dense because, as shown in FIG. 2, there is the same number of P type and N type transistors.

What is claimed is:

1. A memory cell containing information in the form of two complementary logical levels stored in different nodes for storing each logical level in two different nodes, wherein it comprises four subassemblies, each subassembly consisting of a first and second transistor, said first transistor (MPi) being a P type MOS transistor and said second transistor being an N type MOS transistor, the source and drain of the first transistor being connected to a power supply source (+Vdc) and to the drain of the second transistor respectively, the source of the second transistor being connected to the cell earth, the gate and the drain of the first transistor in subassembly index i (i=1, 2, 3) being connected to the drain of the first transistor in subassembly index i+1 and to the gate of the second transistor in subassembly index i+1 respectively, the gate and the drain of the first transistor in subassembly index 4 being connected to the drain of the first transistor in subassembly index 1 and the gate of the second transistor index 1 respectively.

2. A memory cell according to claim 1, wherein it includes means of writing information stored on the drains of said first and second transistors in the same subassembly of index i (i=1, 2, 3, 4) and means of writing information being composed of an N type Ti (i=1, 2, 3, 4) MOS transistor, the drain of which is connected to the drains of said first and second transistors in subassembly index i, the sources of n type Ti MOS transistors indices 1 and 3 being connected to each other and to a first access node (N6), and the sources of transistors indices 2 and 4 being connected to each other and to a second access node (N7).

3. A memory cell according to claim 1 or 2, wherein it comprises means for initializing its contents.

4. A memory cell according to claim 3 wherein the means used to initialize its contents consist of two P type MOS transistors, the gates of which are connected to each other and to a $\overline{\text{SET}}$ control, the drains of which are connected to the same power supply voltage (+Vdc), and the source of one of the transistors is connected to the drains of said first and second transistors of the same subassembly index 2, and the source of the other transistor is connected to the drains of said first and second transistors of the same subassembly index 4, and two P type MOS transistors, the gates of which are connected to each other and to a $\overline{\text{RESET}}$ control, the drains of which are connected to each other and to said power supply voltage, one of the sources being connected to one of the drains of said first and second transistors of the same subassembly index 1, and the other source being connected to the drains of said first and second transistors in the same subassembly index 3.

5. A memory cell according to claim 3, wherein the means used to initialize its contents consist of two N type MOS transistors, the gates of which are connected to each other and to the same (SET) control, the sources of which are connected to the circuit earth, and one of the drains is connected to drains of said first and second transistors in the same subassembly index 2, the other to the drains of the first and second transistors in the same subassembly index 4, and two N type MOS transistors the gates of which are connected to each other and to the same (RESET) control, the sources of which are connected to the circuit earth, and one of the drains is connected to the drains of said first and second transistors in the same subassembly index 1, and the other to the drains on said first and second transistors in the same subassembly index 3.

* * * * *